United States Patent [19]

Tate et al.

[11] Patent Number: 4,855,212

[45] Date of Patent: Aug. 8, 1989

[54] PHOTOPOLYMERIZABLE COMPOSITION

[75] Inventors: Marilyn Tate, Newark; Daniel F. Varnell, Wilmington, both of Del.

[73] Assignee: Hercules Incorporated, Wilmington, Del.

[21] Appl. No.: 148,324

[22] Filed: Jan. 25, 1988

[30] Foreign Application Priority Data

Feb. 6, 1987 [GB] United Kingdom ................ 8702732

[51] Int. Cl.⁴ ............................ G03C 1/68; G03C 1/94
[52] U.S. Cl. ..................................... 430/281; 430/271; 430/277; 430/910; 430/911; 430/912; 430/916; 430/917; 522/89; 522/109
[58] Field of Search ............... 430/281, 910, 911, 912, 430/271, 277, 325; 522/89, 109

[56] References Cited

U.S. PATENT DOCUMENTS

| | | | |
|---|---|---|---|
| 3,469,982 | 9/1969 | Celeste | 96/35.1 |
| 3,769,023 | 10/1973 | Lewis et al. | 96/115 P |
| 3,820,993 | 6/1974 | Lewis et al. | 96/35.1 |
| 4,156,612 | 5/1979 | Muzyczko | 96/115 R |
| 4,228,232 | 10/1980 | Rousseau | 430/271 |
| 4,268,610 | 5/1981 | Roos | 430/281 |
| 4,293,635 | 10/1981 | Flint | 430/271 |
| 4,297,435 | 10/1981 | Jolly | 430/270 |
| 4,316,951 | 2/1982 | Cohen et al. | 430/253 |
| 4,537,855 | 8/1985 | Ide | 430/285 |

FOREIGN PATENT DOCUMENTS 987159  4/1976  Canada .

OTHER PUBLICATIONS

Polymer Blends, vol. 1, Academic Press (1978) N.Y., Ed. D. R. Paul and S. Newman, Appendix to Chapter 1, Table A.

Primary Examiner—Paul R. Michl
Assistant Examiner—Christopher D. RoDee
Attorney, Agent, or Firm—Mark Goldberg

[57] ABSTRACT

Disclosed are improved photopolymerizable compositions which can be developed using aqueous media. The improved compositions contain cellulosic ethers which impart an unexpected improvement in tent strength and optionally contain a plasticizer and a photochemically polymerizable carboxylic acid monomer or both which aid adhesion and stripping.

13 Claims, No Drawings

PHOTOPOLYMERIZABLE COMPOSITION

FIELD OF INVENTION

The present invention relates to a photopolymerizable composition which can be developed using aqueous media. In particular, the present invention relates to a photopolymerizable composition in the form of a dry (i.e. non-solvated) film.

BACKGROUND OF THE INVENTION

Photopolymerizable compositions comprising a carboxyl group-containing, film-forming polymeric binder, an addition photopolymerizable monomer, a thermal polymerizable inhibitor and a free radical photoinitiator are known. These compositions, are called "dry films" and can be developed by aqueous media because of the presence of the carboxyl groups in the polymeric binder. They are often sold as a roll of dry film sandwiched between a flexible support and cover members.

Such photopolymerizable compositions are shipped as dry films and are often subject to cold flow, i.e. the composition flows under pressure, which leads to material fusing together at the edges of the roll (edge fusion). The degree to which this occurs appears to be related to the viscosity of the film. It is desirable to increase the viscosity of the film in order to prevent or at least reduce edge fusion.

Such photopolymerizable compositions are often used as photoresists in the manufacture of printed circuit boards and it is desirable that they be flexible. The more flexible the film is in the polymerized state, the less likely it is to crack and break away from the printed board during board flexing or line trimming.

It is also desirable for a polymerized (cured) film to be strong enough to protect through-holes on a circuit board from processing chemicals and plating. To do this, film must be able to span through-holes up to about 7.0 mm in diameter and remain intact during processing. Spanning of such holes is referred to as tenting.

It is further desirable for the polymerized film to have a level of adhesion to copper following lamination that the film will not lift off the copper during trimming, stacking or removal of cover member prior to development. The film should also maintain good contact with the copper during developing, plating and etching.

In the past, maintaining the flexibility of the cured film has been accomplished by the addition of plasticizers. However, it has been found that the addition of plasticizer has an adverse effect on tenting and increases the amount of cold flow, leading to edge fusion.

It is therefore an object of the present invention to provide a photopolymerization composition which can be used to form dry films having an advantageous combination of properties in the cured and uncured states.

SUMMARY OF THE INVENTION

According to the present invention, there is provided a photopolymerizable composition based on a carboxy group-containing, film-forming polymeric binder, characterized in that the composition includes a cellulosic material such as hydroxypropyl cellulose, ethyl hydroxyethyl cellulose, ethyl cellulose. Preferably, the composition also comprises a plasticizer.

It has been found that the addition of the cellulosic material unexpectedly reduces the cold flow of films formed from the uncured composition and increases tenting strength of the cured composition. Any adverse effect on the flexibility and adhesion to copper caused by the addition of the cellulosic material can be countered by the addition of a plasticizer.

The basic photopolymerization composition will generally, comprise the carboxyl group-containing, film forming polymeric binder, a free-radical photoinitiator, an addition photopolymerizable monomer and a thermal polymerization inhibitor.

Preferably, the composition contains a multifunctional monomer (i.e. a monomer having two or more ethylenic double bonds) to enhance cross-linking and give increased strength properties in the cured film. Suitable multifunctional monomers include trimethylolpropane triacrylate, dipenta-erythritol-hydroxypenta acrylate, di-trimethylolpropane tetracrylate, hexafunctional polyester acrylate, tetrafunctional polyester acrylate, and triethylene glycol diacrylate.

Preferably, the carboxy group-containing, film-forming polymeric binder used in the present composition is prepared from one or more vinyl-type monomers and one or more alpha, beta ethylenically unsaturated carboxyl group-containing monomers having 3 to 15 carbon atoms, which makes the binder soluble in aqueous media. Examples of suitable vinyl-type monomers are alkyl and hydroxyalkyl acrylates and methacrylates having 3 to 15 carbon atoms, styrene and alkyl-substituted styrenes. The acrylates and methacrylates are preferred. Examples of suitable carboxyl group-containing monomers are cinnamic acid, crotonic acid, sorbic acid, acrylic acid, methacrylic acid, itaconic acid, propiolic acid, maleic acid, fumaric acid, and the half esters and anhydrides of these acids. Acrylic and methacrylic acids are preferred. Examples of useful binders are found in U.S. Pat. No. 4,539,286. Other suitable binders are well known to those skilled in the art.

Suitable free-radical photoinitiators are conventional photoinitiators which are activatable by actinic radiation but which are thermally inactive at temperatures below about 185° C. Examples of useful photoiniators are found in U.S Pat. No. 4,268,610. Preferred photoinitiators are aromatic ketones such as benzophenone. Other suitable photoinitiators are known in the art.

It is preferred that a monofunctional carboxyl group-containing addition photopolymerizable monomer is added to the composition because cured films made from a composition containing such a monomer can be stripped from a substrate in small pieces, while without this monomer, the film will strip in large sheets. Stripping in small pieces is preferred since cured film between fine lines can more easily be removed. Moreover, some stripping apparatuses have filtration systems that could be clogged by large sheets. Based on the weight of the photopolymerizable composition, the amount of monofunctional monomer used is preferably from 1 to 10%, more preferably from 1.5 to 6%. Suitable monofunctional monomers include itaconic acid, beta carboxy ethylacrylate, citraconic acid, crotonic acid, monomethylacryloyloxyethyl phthalate, monoacryloylethyl phthalate and fumaric acid. Itaconic and beta carboxy-ethylacrylate are preferred.

The thermal polymerization inhibitor which may be used in the composition prevents thermal polymerization during drying and storage of the composition. Examples of suitable polymerization inhibitors are p-methoxy-phenol, hydoquinone, alkyl- and aryl-substituted hydroquinones and quinones, tert-butyl catechol, pyrogallol, copper resinate, beta naphthol, 2,6-ditert-butyl-p-cresol, 2,2'-methylene-bis (4-ethyl-6-t-butylphenol), p-tolyl quinone, chloranil, aryl phosphites and aryl alkyl phosphites.

The basic photopolymerizable composition may also include, if desired, additives well known in the art, such as leuco (i.e. printout) dyes, background dyes, adhesion promoters and antioxidants, for instances as disclosed in U.S. Pat. No. 4,297,435. Other optical additives known to those skilled in the art may, if desired, be added to the basic composition, but are not essential.

DETAILED DESCRIPTION OF THE INVENTION

The basic photopolymerizable composition is generally prepared by mixing the various components in a solvent. Suitable solvents include alcohols, ketones, halogenated hydrocarbons and ethers. After mixing, the composition is coated onto a support and the solvent is evaporated. Suitable procedures for carrying out this process are disclosed in U.S. Pat. No. 3,469,982 and U.S Pat. No. 4,392,635. These processes can be used to produce rolls of dry film sandwiched between a flexible support member and a flexible cover member. It will, however, be apparent to those skilled in the art that dry films can also be made on inflexible supports and may be supplied as stacks of laminated sheets, for instance as disclosed in U.S. Pat. No. 4,268,610.

When hydroxypropyl cellulose (HPC) is used as the cellulosic additive to the basic photopolymerizable composition, it is preferred that the HPC has a molecular weight between 60 and 100 kD. HPC is available commercially in various grades. Although any grade may be used, it has been found that the higher molecular weight grades are more difficult to dissolve in solvents compatible with the remaining components of the composition. Moreover, as the molecular weight increases the rate for removal of unpolymerized film (during development) is reduced. It is therefore preferred that the lower molecular weight grades of HPC are used.

In preparing compositions according to the present invention, the HPC will generally be dissolved in a solvent and then added to the basic composition. In order to ensure that the solution thus formed is homogeneous, it is desirable to ensure that the solvents are compatible. Suitable solvents for the HPC include methanol, at relatively low levels, cyclohexanone, at high levels, and acetic acid (at high or low levels). A person skilled in the art will be able readily to determine other suitable solvents by trial and error experimentation to find those which are compatible with the basic composition solvent, do not cause gelling of the composition on mixing, and which can be easily removed on heating. In this respect, it has been noted that tetrahydrofuran and N-methylpyrrolidone are not particularly suitable since they cause gelation of the mixed solution.

Preferably, where HPC is used, the composition contains 10 to 20% (by weight), more preferably 14 to 17%, HPC. Advantageously, where HPC is used, the composition contains 2 to 10% (by weight), more preferably 4 to 7%, plasticizer, and 1.5 to 9% (by weight), more preferably 3 to 6%, multifunctional monomer.

In preparing compositions according to the present invention containing ethylhydroxyethyl cellulose (EHEC) as the cellulosic material, it is preferred to use EHEC having a viscosity (measured as a 5% solution in a solvent comprising 80% (by weight) toluene and 20% (by weight) ethanol at 25° C.) from 10 to 50 centipoise. More preferably, the viscosity is above 20 and below 34 centipoise.

Preferably, the composition contains from 2 to 15% (by weight) of the EHEC, more preferably from 8 to 12%. Advantageously, the composition contains, in addition to the EHEC, 2 to 10% (by weight), more preferably 4 to 7%, plasticizer.

The EHEC is generally soluble in the solvent used to form the basic composition, and may therefore be added in with the other components of the composition to form a solution for preparing dry films.

When ethyl cellulose (EC) is used as the cellulosic material, it is preferred that the EC have a relatively low ethoxy content in the range 45 to 50%. Advantageously, EC having a relatively low molecular weight is used. The molecular weight can be judged by measuring its viscosity as described above with reference to EHED. Preferably, the EC has a viscosity of approximately 10 centipoise.

EC is not in all cases compatible with the basic composition, and therefore not all grades of EC can be used in compositions according to the present invention. However, it is merely a matter of routine experimentation to determine which grades are suitable for use with any particular basic composition.

Preferably, the composition contains from 2 to 15% (by weight) of the EC, more preferably from 7 to 12%. Advantageously, the composition contains, in addition to the EC, from 2 to 10% (by weight) of plasticizer.

The preferred plasticizers for use in the compositions of the present invention are N-ethyl toluene sulfonamide (N-ETSA), tri-n-butyl citrate (TBC), glycerol triacetate and the reaction product of (i) an isocyanate-terminated block copolymer of polyester diol blocks and polyalkylene glycol/ethylene oxide blocks and (ii) at least one hydroxy-substituted acrylate or methacrylate. Other plasticizers which can be used are well kown to those skilled in the art and include diethyl phthalate, dimethyl sebacate, tricresyl phosphate, acetyl tri-n-butyl citrate and dicaproyl adipate.

The reaction product of the isocyanate terminated block copolymer of polyester diol blocks and polyalkylene glycol/ethylene oxide blocks and the hydroxy substituted acrylate or methacrylate which may be used in the compositions of the present invention may be made by methods well known to those skilled in the art, such as disclosed in U.S. Pat. No. 3,960,572. Suitable polyesterdiols include polyethylene adipatediol, polypropylene adipatediol, polybutylene adipatediol, polyhexamethylene adipatediol and polyethylene succinatediol. Polyethylene adipatediol is preferred. Useful polyalkylene glycols include ethylene glycol and propylene glycol. Ethylene glycol is preferred. Diisocyanates suitable for terminating the block copolymer include toluene diisocyanate and paraphenylene diisocyanate. Toluene diisocyanate is preferred. Suitable hydroxy substituted acrylates or methacrylates include 2-hydroxyethyl acrylate or methacrylate, hydroxypropyl acrylate or methacrylate and polypropylene glycol monomethacrylate. Hydroxypropyl methacrylate and polypropylene glycol monomethacrylate are preferred. Examples of a suitable reaction product of an isocyanate terminated block copolymer and a hydroxy substituted acrylate or methacrylate are disclosed in U.S. Pat. No. 3,960,572, as are other suitable diisocyanates, polyesterdiols, polyalkylene glycols, and hydroxy substituted acrylates or methacrylates. A preferred molar ratio is 1:1:3:2 (polyester diol:polyalkylene glycol/ethylene oxide:isocyanate) and 1:2-2.5 (isocyanate:hydroxy substituted acrylate or methacrylate).

In a preferred embodiment, the photopolymerizable composition of this invention is used as a photoresist in the manufacture of printed circuit boards. Generally, the composition is coated onto the copper surface of a copper clad substrate, exposed to actinic radiation through a negative to create a latent image of photopolymerized material and developed in a known aqueous developing solution to remove the unpolymerized composition from the copper surface. The portions of the surface not covered by the photopolymerized material may then be modified by known processes, e.g. by plating or etching procedures, while the photoresist protects the covered surface. The photopolymerized material can be ultimately removed from the substrate by washing with known stripping solutions.

The photopolymerizable composition of the present invention is applied to the copper substrate by known procedures, such as hot shoe or hot roll lamination of the dry film attached to a transparent, peelable support, which support is removed after polymerization, as disclosed in U.S. Pat. No. 4,293,635. Generally, the amount of actinic radiation used to polymerize the composition varies from 35 to 150 mJ/cm$^2$, with precise amounts determinable by those skilled in the art based on the specific composition used.

The copper clad substrate may be any known copper and dielectric laminate used in circuit board manufacture, such as a copper clad board of fiberglass reinforced epoxy resin.

Suitable aqueous developing solutions generally have, by weight, 0.5 to 10% alkaline agents, preferably 0.5 to 1%, and the latent imaged board is washed in the solution for a time sufficient to remove the unpolymerized composition. Useful alkaline agents include alkali metal hydroxides, e.g. lithium, sodium and potassium hydroxide, the base reacting alkali metal salts of weak acids, e.g. sodium carbonate and bicarbonate, and alkali metal phosphates and pyrophosphates. Sodium carbonate is preferred. The circuit board can be submerged in the developing solution or, preferably, the solution is high pressure sprayed on the board.

In general, the stripping solutions are heated aqueous alkaline solutions, using the same alkaline agents as the developing solutions, but have a higher alkaline concentration, i.e. generally, by weight, from 1% to 10%, preferably from 1% to 3%. Generally, the stripping solution is heated to a temperature of 45° C., preferably 50° C. to 55° C. Washing the substrate to remove the photopolymerized material is by methods well known to those skilled in the art, such as spraying the substrate with the heated stripping solution or, preferably, agitating the substrate in a heated bath of the stripping solution.

Examples of photoimaging techniques and equipment, including radiation sources, exposure intensity and duration, developing and stripping solutions and techniques, and laminated board composition are disclosed in U.S. Pat. No. 3,469,982, U.S. Pat. No. 4,293,635, and U.S. Pat. No. 4,268,610.

One of the advantages of the composition of the present invention is that it remains flexible upon photopolymerization. This advantage is important in view of the possible uses of the composition and the processing steps commonly encountered in circuit board manufacture. In particular, flexing of laminated substrates will not cause cracking and even where flexible substrates are not used, the photopolymerized material will resist chipping as the laminated boards are handled.

It will be apparent that the composition of the present invention is useful in solvated form. For example, in silk screen printing techniques for circuit board manufacture, the composition of the present invention may be applied to circuit boards in solvated form. Screen printing techniques are disclosed in *Printed Circuit Handbook*, 2nd edition, ed. by Clyde F. Coombs, Jr., (1979). Also, in photoimaging techniques as described above, the composition can be coated onto the substrate is solvated form, and the solvent then evaporated.

Test Methods

Dry-Film Viscosity Measurement

Zero shear viscosity ($n_0$) is measured with Rheometrics Stress Rheometer (RSR) at 60° C. A constant shear load of 5000 grams is used. The creep of the sample is recorded for 1000 seconds after which the stress is removed and the creep recovery measured. $n_0$ is determined from the time divided by the compliance (J) after a steady state is reached. If $J=9.0\times10^{-4}$ (sq cm/dyne) at 1000 seconds then $n_0=1.1\times10^6$ poises.

Samples consist of a disk 80 mil (2 mm) thick. They are prepared by laminating dry unexposed films formed from drawdowns.

Test Strength Measurement

Samples for measuring tent strength consist of a double sided copper laminate covered on both sides with photoresist. The copper panl is such that there are numerous 0.25 inch (6.3 mm) holes through the panel. The resist spans these holes on both sides. The holes should be free of burrs.

Following polymerization by UV light and exposure to a developing solution for typical developing dwell times, the strength of the resist is measured by placing a 3.2 mm diameter ball bearing on a tended hole, and then pushing the ball through the hole. The rate of movement through the holes is kept constant at a rate of 1.27 mm/min. The maximum load in grams recorded before failure of the tent is taken as the tent strength of the film.

Adhesion Tests

Adhesion of photoresist to a copper panel following lamination is measured by the following pass/fail test. The film is laminated to a copper clad laminate that has been cleaned in an appropriate manner. After 15 minutes, the resist cover sheet is removed and tape is applied to the resist surface. A weighted roller is passed over the tape to insure good contact. The tape is then quickly pulled off the resist. If the resist comes off with the tape, it failed this test. If it remains on the copper, it passes the test. Scotch 600 tape is used for this evaluation. The same test can be used to check adhesion of cured portions of resist remaining on the copper following developing. Some lifting of very fine lines (less than approximately 50 microns) is acceptable. Lifting of larger lines indicates a problem with adhesion.

To more adequately describe the invention, the following Examples and Controls are included. However, the instant invention is not intended to be limited thereby. All parts and percentages in the Examples and Controls are by weight unless otherwise indicated. In these examples, the "''" indicates a composition where the solvent has been evaporated to leave a "dry film."

EXAMPLES

HYDROXYPROPYL CELLULOSE (Examples 1 to 4)

EXAMPLE 1

TABLE 1

| Composition of Solutions | | |
|---|---|---|
| | Composition (Parts) | |
| Component | 1A | 1B |
| Butylated hydroxy toluene (BHT) | 0.01 | 0.01 |
| Benzophenone | 2.7 | 3.2 |
| Michler's ketone | 0.12 | 0.15 |
| Acrylic binder[1] | 32.7 | 41.75 |
| triethyleneglycol diacrylate (TDA) | 4.5 | 6.15 |
| trimethyolpropane triacrylate (TMPTA) | 6.7 | 6.15 |
| hydroxypropyl cellulose (HPC) (Klucel L) | 11.1 | — |
| N—ethyl toluene sulfonamide (N-ETSA)[2] | 5.0 | — |
| blue dye solution[3] | 0.48 | 0.48 |
| Methyl Ethyl Ketone | 30.0 | 20.0 |

[1] prepared from 49.5% ethyl methacrylate, 35.5% ethyl acrylate and 15% methacrylic acid, dissolved in methyl ethyl ketone (wt %)
[2] plasticizer
[3] methanol solution of Victoria Blue and Brilliant green Solutions 1A and 1B are stirred 1.5 hours at 1000 rpm at room temperature. Films are cast onto polyester using appropriate doctor blades to obtain thicknesses of 37.5 microns. The films are allowed to air dry overnight at room temperature. Copper clad epoxy-fiberglass (both sides) laminates with holes of up to 6.0 mm diameter are cleaned and scrubbed. Dry films are laminated to them on both sides simultaneously on a hot roll laminator at 105° C. at 1.22 meters/minute. Films are exposed to ultraviolet light through diazo artwork with a medium pressure mercury vapor arc lamp. The developing is done in dilute alkaline solution at 29° C., 20 psi spray pressure.

Films of experimental formulation 1A come through the spray developer with all the film over the holes intact. The control film, 1B has an approximate breakage of 10% (average). The pen click tests, in which a pen is pushed on the film, the example film is much more resistant to the pen pressure than the control.

To test the flexibility, copper panels are prepared with no holes. An image is prepared that has several size lines and spaces. Razor cuts are made across the resist lines. The control film chipped badly while the experimental film is cut cleanly with no observed chipping. To further test the flexibility, films are laminated to cleaned, flexible copper substrates, exposed to an equivalent of Stouffer Step 25 on a Stouffer Scale of 40, then compared using a Gardner MG-146 Conical Mandrel. The control film 1B, repeatedly cracked completely across the 25 mm sample, whereas the experimental film 1A, showed no cracks at all.

EXAMPLE 2

This example illustrates the superior tent strength of films with hydroxypropyl cellulose. The photopolymerizable composition is prepared using the ingredients listed below:

TABLE 2

| Composition of Solutions | |
|---|---|
| Component | Composition (Parts) 2C |
| BHT | 0.01 |
| benzophenone | 2.7 |
| Michler's ketone | 0.12 |
| Acrylic binder | 32.7 |
| TDA | 4.5 |
| TMPTA | 6.7 |
| hydroxypropyl cellulose (Klucel L) | 11.1 |
| tributyl citrate (plasticizer) | 5.0 |
| blue dye solution | 0.48 |
| MEK | 30.0 |

A control solution is prepared as outlined in 1B. Films are prepared and imaged on copper panels (with holes) as described in Example 1. The boards are subjected to a strength test in which ball bearings are pushed through the films over the 6.0 mm holes. The force required to break the film and the distance the film can be displaced before breaking are recorded. The film of this example required an average of 280 grams to break it and is displaced 1.5 millimeters. The control film broke under a load of 45 grams at a distance of 0.2 mm. The film of this example is clearly stronger and more extensible than the control.

EXAMPLE 3

This example will show that films with hydroxypropyl cellulose, although strong, are not as flexible without a plasticizer. The following photopolymerizable compositions were prepared:

TABLE 3

| Composition of Solutions | | |
|---|---|---|
| | Composition (Parts) | |
| Component | 3D | 3E |
| BHT | 0.01 | 0.01 |
| benzophenone | 2.7 | 2.7 |
| Michler's ketone | 0.12 | 0.12 |
| Acrylic binder | 32.7 | 32.7 |
| TDA | 4.5 | 4.5 |
| TMPTA | 6.7 | 6.7 |
| hydroxypropyl cellulose (Klucel L) | 11.1 | 11.1 |
| tributyl citrate | | 7.3 |
| blue dye solution | 0.48 | 0.48 |
| MEK | 30.0 | 30.0 |

Films are prepared and imaged as discussed in prior examples. Films are tested for flexibility by cutting with razor blades across the exposed lines. Smaller lines and spaces are usually more prone to exhibit chipping. Film 3D exhibited poor flexibility in that it chipped in even the larger 20/20-mil resist lines/copper spaces. Film 3E was cut cleanly in the 4/1-mil lines and spaces with no apparent chipping. The presence of a plasticizer clearly improves the film flexibility.

EXAMPLE 4

This example illustrates the improved resistance to cold flow of films containing hydroxypropyl cellulose. The following photopolymerizable compositions are prepared:

TABLE 4

Composition of Solutions

| Component | Composition (Parts) 4F | 4G |
|---|---|---|
| BHT | 0.01 | 0.01 |
| benzophenone | 2.7 | 2.7 |
| Michler's ketone | 0.12 | 0.12 |
| Acrylic binder | 32.7 | 41.75 |
| TDA | 4.5 | 4.5 |
| TMPTA | 6.7 | 6.15 |
| HPC | 11.1 | — |
| tributyl citrate | 5.0 | — |
| blue dye solution | 0.48 | 0.48 |
| MEK | 30.0 | 30.0 |

Several 37.5 micron (1.5-mil) films are prepared. These were layered to form 80-mil thick test samples. Zero shear viscosity measurements are made with a Rheometrics Stress Rheometer at 60° C. at a stress of 5000 dynes/sq. cm. Data are given in Table 5.

TABLE 5

| Sample | Zero Shear Viscosity |
|---|---|
| 4F' | 2.1 E7 |
| 4G' | 1.8 E6 |

The higher viscosity of the film with HPC suggests that it will cold flow much slower than the control film, 4G'. This, in turn, should mean less edge fusion.

ETHYL CELLULOSE (EC) (Examples 5 and 6)

EC is available in numerous grades. Hercules Incorporated offers three ranges of ethoxyl content: EC-K with 46.1 to 47.12%, EC-N with 48.0 to 49.5%, and EC-T with greater than 49.6%. Within each grade, there are a variety of molecular weights which are classified by viscosity. An EC N10 grade has a viscosity of 10 cps in a 5% solution in 80:20 tolulene:ethanol.

Not all grades perform equally. High viscosities (molecular weights) and high levels of ethoxyl substitution (EC is formed by reacting hydroxyl groups on cellulose) tend to lead to immiscibility with the basic compositions that have been studied. Table 6 briefly summarizes the data. Of those grades that are miscible the higher the viscosity the greater the increase of tent strength and film viscosity. However developing times also increase.

TABLE 6

Miscibility

| % Ethyl Cellulose | Grade of EC | % Plasticizer | Plasticizer | Miscibility* |
|---|---|---|---|---|
| 8 | N4 | — | — | C |
| 8 | T10 | — | — | C |
| 8 | T50 | — | — | I |
| 8 | N50 | — | — | C |
| 8 | T200 | — | — | I |
| 8 | K12 | — | — | C |
| 8 | N29 | — | — | C |
| 8 | N16 | 7.5 | LPE | I |
| 8 | T10 | 7.5 | LPE | P |
| 8 | N12** | 7.5 | LPE | C |
| 8 | N29 | 7.5 | LPE | I |
| 8 | N10*** | 7.5 | LPE | P |
| 8 | N8*** | 7.5 | LPE | P |
| 8 | N6 | 7.5 | LPE | C |

*I = immiscible
P = partly miscible
C = completely miscible
**at lower end of ethoxyl range
***at higher end of ethoxyl range Two plasticizers are used in the illustrative Examples of the use of EC. The first one is LPE, a polyether polyester urethane acrylic terminated prepolymer made by Hercules Incorporated. It is part of a family of materials which are reaction products of (i) an isocyanate terminated block copolymer of polyesterdiol blocks and polyalkylene glycol/ethylene oxide blocks and (ii) at least one hydroxy-substituted acrylate or methacrylate. Examples and preparation of such materials are disclosed in U.S. Pat. No. 3,960,572. The second plasticizer is Jeffamine D2000 from Texaco Chemical Co. part of Texaco Inc. D2000 is an amine terminated propylene oxide oligomer of approximately 2000 molecular weight.

EXAMPLE 5

This example illustrates the improvement of tenting strength of a photopolymerizable material gained by the addition of EC. Poorer adhesion to copper is observed because of the EC. One sample does not contain EC (control) whereas the other sample 6J contains EC. The compositions of the coating solutions and dry films are listed in Tables 7 and 8 respectively.

The ingredients of each composition listed in Table 7 are thoroughly mixed at room temperature for three hours by a mechanical stirrer. The stirrer is turning at approximately 1000 rpm. These mixtures are then coated with a doctor blade onto a polyester support film. The films are dried by solvent evaporation in air at room temperature over 16 hours. For experimental purposes, both dry film thicknesses are about 38 micrometers.

TABLE 7

Composition of Solutions

| Component | Composition (Parts) Sample 6H | Control |
|---|---|---|
| Triethylene glycol dimethacrylate (TDMA) | 6.15 | 6.15 |
| Trimethylol propane triacrylate (TMPTA) | 6.15 | 6.15 |
| Benzophenone (Benzo) | 3.20 | 3.20 |
| Michlers Ketone (Mich) | .15 | .15 |
| Pentabromochlorocyclohexane (PBCH) | .80 | .80 |
| Butylated hydroxy toluene (BHT) | .01 | .01 |
| Acrylic binder (AB) | 35.7 | 41.5 |
| Ethycellulose - N29 (EC-N29) | 5.80 | — |
| Methyl ethyl ketone (MEK) | 60.0 | 60.0 |

TABLE 8

Composition of Dry Films

| Component | Composition (Parts) Sample 6H' | Control |
|---|---|---|
| TDMA | 10.6 | 10.6 |
| TMPTA | 10.6 | 10.6 |
| Benzo | 5.52 | 5.52 |
| Mich | .26 | .26 |

TABLE 8-continued

| | Composition of Dry Films | |
|---|---|---|
| | Composition (Parts) | |
| Component | Sample 6H' | Control |
| PBCH | 1.38 | 1.38 |
| BHT | .02 | .02 |
| AB | 61.6 | 71.6 |
| EC-N29 | 10.0 | — |

Samples for tent strength measurements are prepared by laminating film to both sides of copper clad panels with copper on the surfaces of each side. The panels contain 0.25 inch (0.625 centimeter) though holes which the film spans ('tents'). The copper is scrubbed prior to lamination. Before testing the films are exposed to a medium pressure Hg lamp and developed in a 0.75% sodium carbonate-mono hydrate solution maintained at 29° C. The exposure induces photopolymerization. The samples are polymerized by exposure such that each is equivalent on a Stouffer Scale following developing.

The actual tent strength is measured by pushing a round probe through the center of a hole that is spanned by the films. The load needed to rupture the film is recorded and used as the measure of tent strength.

TABLE 9

| | Tent Strength |
|---|---|
| Sample | Tent Rupture Strength (g) |
| Sample 6H' | 65 ± 19 |
| Control | 37 ± 7 |

The tent strengths of Sample 6H' and the control are listed in Table 9. Addition of EC improved the strength of tents. For this sample, binder is replaced with EC=N29 such that the dry film contained 10 percent EC.

Addition of EC reduced the adhesion between resist and copper both after lamination and after developing. Table 10 lists the results from tape tests. The adhesion after lamination is measured by removing the cover sheet on a resist covered copper panel, applying a tape to the resist surface, and removing the tape. If the resist lifts with the tape, then the resist fails the test. If no resist comes off the copper with the tape, the resist passes the test. The samples containing EC failed the test.

TABLE 10

| | Example 5 - Adhesion | |
|---|---|---|
| Sample | Adhesion After Lamination | Adhesion After Developing |
| Control | pass | pass |
| Sample 6J' | fail | fail |

EXAMPLE 6

This example illustrates the advantage gained by the addition of both EC and LPE to a photoresist formulation. Both EC and LPE are added in place of binder. Table 11 lists the control and modified formulations. Samples for tenting strength, adhesion and viscosity measurements are prepared by the procedure described in Example 5. Tables 12 and 13 list the results.

Adding LPE by itself in place of binder lowers the viscosity. However, when combined with the addition of EC, the viscosity is greater than the control. The tent strength is greatly improved. Both the control and the formulation with EC and plasticizer passed the adhesion test after lamination. The sample with EC still failed the tape test after developing. If one refers to Example 5, it is apparent that the plasticizer corrected the loss of adhesion after lamination that is associated with the addition of EC.

TABLE 11

| | Composition - Example 6 (Dry Film) | |
|---|---|---|
| | | Composition (Parts) |
| Component | Control | Sample 8I |
| TDMA | 10.5 | 10.5 |
| TMPTA | 10.5 | 10.5 |
| Benzo | 5.52 | 5.52 |
| Mich | .26 | .26 |
| PBCH | 1.38 | 1.38 |
| BHT | .02 | .02 |
| AB | 71.6 | 54.1 |
| EC-K12 | — | 10.00 |
| LPE | — | 7.50 |

TABLE 12

| | Properties - Example 6 | |
|---|---|---|
| Sample | Zero Shear Viscosity (poise) | Tent Rupture Strength (g) |
| Control | 1.1 × 10$^6$ | 40 ± 6 |
| Sample 8I' | 1.5 × 10$^6$ | 173 ± 30 |

TABLE 13

| | Example 6 - Adhesion | |
|---|---|---|
| Sample | Adhesion After Lamination | Adhesion After Developing |
| Control | pass | pass |
| Sample 8I' | pass | fail |

Resistance to cold flow is determined by measuring the zero shear viscosity on a creep rheometer at 60° C. and 5000 dynes/cm$^2$. The higher the viscosity the greater the resistance to cold flow. Samples for this test, which are described after these Examples, are made by removing the support film and layering the dry compositions into a 80 mil (2 mm) thick specimen.

ETHYL HYDROXYETHYL CELLULOSE (EHEC) (Examples 7 to 9)

The EHEC used in these Examples was manufactured by Hercules Incorporated. It is classified by viscosity (centipoise at 25° C. of a 5% solution with the solvent being an 80:20 mixture by weight of toluene and ethanol respectively). Two plasticizers have been used in these Examples. They are tri-n-butylcitrate and LPE.

EXAMPLE 7

This example illustrates the improvement of tenting strength and resistance to cold flow of a photopolymerizable material gained by the addition of EHEC. Poorer adhesion to copper is observed because of the EHEC. One sample does not contain EHEC (control) whereas the other samples (7J and 7K) contain EHEC. The compositions of the coating solutions and dry films are listed in Tables 14 and 15 respectively.

The ingredients of each composition listed in Table 14 are thoroughly mixed at room temperature for three hours by a mechanical stirrer. The stirrer is turning at approximately 1000 rpm. These mixtures are then coated with a doctor blade onto a polyester support film. The films are dried by solvent evaporation in air at room temperature over 16 hours. For experimental purposes, both dry film thicknesses were about 38 micrometers.

TABLE 14

Compositions of Solutions

| Component | Composition (Parts) | | |
|---|---|---|---|
| | 7J | Control | 7K |
| Triethylene glycol dimethacrylate (TDMA) | 6.15 | 6.15 | 6.15 |
| Trimethylol propane triacrylate (TMPTA) | 6.15 | 6.15 | 6.15 |
| Benzophenone (Benzo) | 3.20 | 3.20 | 3.20 |
| Michlers Ketone (Mich) | .15 | .15 | .15 |
| Pentabromochlorocyclohexane (PBCH) | .80 | .80 | .80 |
| Butylated hydroxy toluene (BHT) | .01 | .01 | .01 |
| Acrylic binder (AB) | 35.7 | 41.5 | 36.9 |
| Ethy Hydroxyethylcellulose-low (EHEC-1) | 5.80 | — | 4.64 |
| Methyl ethyl ketone (MEK) | 60.0 | 60.0 | 60.0 |

TABLE 15

Composition of Dry Films

| Component | Composition (Parts) | | |
|---|---|---|---|
| | Sample 7J' | Control | Sample 7K' |
| TDMA | 10.6 | 10.6 | 10.6 |
| TMPTA | 10.6 | 10.6 | 10.6 |
| Benzo | 5.52 | 5.52 | 5.52 |
| Mich | .26 | .26 | .26 |
| PBCH | 1.38 | 1.38 | 1.38 |
| BHT | .02 | .02 | .02 |
| AB | 61.6 | 71.6 | 63.6 |
| EHEC-1 | 10.0 | — | 8.00 |

Resistance to cold flow was determined by measuring the zero shear viscosity on a creep rheometer at 60° C. and 5000 dynes by the method set out after these Examples. The higher the viscosity the greater the resistance to cold flow. Samples for this test are made by removing the support film and layering the dry compositions into an 80 mil (2 mm) thick specimen.

Samples for tent strength measurements are prepared by laminating film to both sides of copper clad panels with copper on the surfaces of each side. The panels contain 0.25 inch (0.635 centimeter) though holes which the film spans ('tents'). The copper is scrubbed prior to lamination. Before testing the films are exposed to a medium pressure Hg lamp and developed in a 0.75% sodium carbonate-mono hydrate solution maintained at 29° C. The exposure induces photopolymerization. The samples are polymerized by exposure such that each is equivalent on a Stouffer Scale following developing.

The actual tent strength is measured by pushing a round probe through the center of hole that is spanned by the films as described after these Examples. The load needed to rupture the film is recorded and used as the measure of tent strength.

The viscosities for Sample 7J' and the control are listed in Table 16. Replacement of binder by EHEC, such that the dry film contained 10 weight percent EHEC, raised the viscosity by a factor of 5.5 Such an increase significantly reduces edge fusion.

TABLE 16

| Sample | Film Viscosity Zero Shear Viscosity (poise) |
|---|---|
| Sample 7J' | $5.5 \times 10^6$ |

TABLE 16-continued

| Sample | Film Viscosity Zero Shear Viscosity (poise) |
|---|---|
| Control | $1.0 \times 10^6$ |

TABLE 17

| Sample | Tent Strength Tent Rupture Strength (grams) |
|---|---|
| Sample 7K' | 371 ± 98 |
| Control | 51 ± 7 |

The tent strengths of Sample 7K' and the control are listed in Table 17. Addition of EHEC greatly improved the strength of tents. For this sample, bonder was replaced with EHEC-low such that the dry film contained eight percent EHEC.

Addition of EHEC reduced the adhesion between resist and copper both after lamination and after developing. Table 18 lists the results from tape test as described in these Examples. The adhesion after lamination was measured by removing the cover sheet on a resist cover copper panel, applying a tape to the resist surface, and removing the tape. If the resist lifts with the tape then the resist fails the test. If no resist comes off the copper with the tape, the resist passes the test. The samples containing EHEC failed the test.

TABLE 18

| | Example 7 - Adhesion | |
|---|---|---|
| Sample | Adhesion After Lamination | Adhesion After Developing |
| Control | pass | pass |
| Sample 7J' | fail | fail |

EXAMPLE 8

This example illustrates the advantage gained of the addition of both EHEC (low grade) and Tri-n-butyl citrate (TBC) to a photoresist formulation. Both EHEC and TBC were added in place of binder. Table 19 lists the control and modified formulations. Samples for tenting strength adhesion and viscosity measurements are prepared and the results are shown in Tables 20 and 21.

Adding TBC by itself in place of binder lowers the viscosity. However, when combined with the addition of EHEC, the viscosity remained similar to the central. The tent strength is greatly improved. Both the control and the formulation with EHEC and plasticizer passes the adhesion tests.

TABLE 19

Compositions - Example 8 (dry film)

| Component | Composition (Parts) | |
|---|---|---|
| | Control | Sample L' |
| TDMA | 6.15 | 6.15 |
| TMPTA | 6.15 | 6.15 |
| Benzo | 5.52 | 5.52 |
| Mich | .26 | .26 |
| PBCH | 1.38 | 1.38 |
| BHT | .02 | .02 |
| AB | 71.6 | 57.1 |
| EHEC-1 | — | 8.00 |
| TBC | — | 6.50 |

TABLE 20

Properties - Example 8

| Sample | Zero Shear Viscosity (poise) | Tent Rupture Strength (g) |
| --- | --- | --- |
| Control | 9.5 × 10$^5$ | 44 |
| Sample L' | 9.4 × 10$^5$ | 302 |

TABLE 21

Example 8 - Adhesion

| Sample | Adhesion After Lamination | Adhesion After Developing |
| --- | --- | --- |
| Control | pass | pass |
| Sample L' | pass | pass |

EXAMPLE 9

This example demonstrates the use of a different grade of EHEC. EHEC-extra low is combined with LPE and added in place of binder. Unlike EHEC-low, EHEC-extra low can be used with large percentages of LPE. EHEC-extra low does not raise the viscosity of the dry film as much as EHEC-low for the same added percentages. However, like EHEC-low it does improve tent strength. The improvement is not as great as with EHEC-low. Tables 22 and 23 list the formulations and properties. The viscosity of the dry-film actually decreased in this example. However, the tent strength is improved compared to the control.

TABLE 22

Compositions - Example 9 (dry film)

| Component | Composition (Parts) | |
| --- | --- | --- |
| | Control | Sample 8M |
| TDMA | 6.15 | 6.15 |
| TMPTA | 6.15 | 6.15 |
| Benzo | 5.52 | 5.52 |
| Mich | .26 | .26 |
| PBCH | 1.38 | 1.38 |
| BHT | .02 | .02 |
| AB | 71.6 | 57.1 |
| EHEC-xl | — | 8.00 |
| LPE | — | 7.50 |

TABLE 23

Properties - Example 9

| Sample | Zero Shear Viscosity (poise) | Tent Rupture Strength (g) |
| --- | --- | --- |
| Control | 11.0 × 10$^5$ | 47 |
| Sample 8M' | 5.0 × 10$^5$ | 175 ± 60 |

What is claimed is:

1. In a photopolymerizable composition comprising a carboxyl group-containing, film forming polymeric binder, wherein said binder is prepared from one or more monomers selected from the group consisting of alkyl and hydroxyalkyl acrylates and methacrylates having 3 to 15 carbon atoms, styrene and alkyl-substituted styrenes and one or more alpha, beta ethylenically unsaturated carboxyl group-containing monomers, a free radical photoinitiator, addition photopolymerizable monomers, and a thermal polymerization inhibitor, the improvement wherein the composition further comprises, from about 2 to about 20 weight percent of a cellulosic material wherein said cellulosic material is miscible in said composition.

2. The composition of claim 1 wherein the cellulosic material is hydroxypropyl cellulose of a molecule weight of from about 60 to 1000 kilodaltons.

3. The composition of claim 2 which further contains a plasticizer.

4. The composition of claim 1 wherein the cellulosic material is ethylhydroxyethyl cellulose having a five percent by weight solution viscosity in 80 percent toluene and 20 percent ethanol of from about 10 to about 50 centipoise.

5. The composition of claim 4 which further contains a plasticizer.

6. The composition of claim 1 wherein the cellulosic material is ethylcellulose having a five percent by weight solution viscosity in 80 percent toluene and 20 percent ethanol of from about 10 to about 50 centipoise.

7. The composition of claim 6 which further contains a plasticizer.

8. The composition of claim 5 wherein the plasticizer is selected from the group consisting of phthalates, citrates, phosphates, sebacates, adipats, or a reaction product of (1) an isocyanate terminated block copolymer of polyseterdiol blocks and polyalkylene glycol and ethylene oxide blocks and (ii) at least one hydroxy substituted acrylate or methacrylate.

9. The composition of claim 1 further comprising a monofunctional carboxyl group-containing photopolymerizable monomer.

10. The composition of claim 9 wherein the monofunctional carboxyl group-containing photopolymerizable monomer is itaconic acid.

11. In a photopolymerizable element comprising a photoplymerizable composition sandwiched between a support member and a cover member, the improvement wherein the photopolymerizable composition is the photopolymerizable composition of claim 1.

12. In a process comprising the steps of coating a photopolymerizable composition comprising a carboxyl group-containing, film forming polymeric binder, wherein said binder is prepared from one or more monomers selected from the group consisting of alkyl and hydroxyalkyl acrylates and methacrylates having 3 to 15 carbon atoms, styrene and alkyl-substituted styrenes and one or more alpha, beta ethylenically unsaturated carboxyl group-containing monomers, a free radical photoinitiator, addition photopolymerizable monomers, and a thermal polymerization inhibitor onto a copper clad substrate, exposing the composition imagewise to sufficient actinic radiation to polymerize the composition in the exposed areas, and removing the unpolymerized composition from the substrate, the improvement wherein the photopolymerizable composition further comprises from about 2 to about 20 weight percent of a cellulosic material wherein said cellulosic material is miscible in said composition.

13. The cured composition of claim 1 which has a tent rupture strength of greater than about 50 grams.

* * * * *

UNITED STATES PATENT AND TRADEMARK OFFICE
CERTIFICATE OF CORRECTION

PATENT NO. : 4,855,212
DATED : August 8, 1989
INVENTOR(S) : TATE & VARNELL

It is certified that error appears in the above-identified patent and that said Letters Patent is hereby corrected as shown below:

Column 2, Line 66, " hydoquinone "

should read -- hydroquinone --

Column 3, Line 8, " optical "

should read -- optional --

Column 4, Line 18, " EHED "

should read -- EHEC --

UNITED STATES PATENT AND TRADEMARK OFFICE
CERTIFICATE OF CORRECTION

PATENT NO. : 4,855,212
DATED : August 8, 1989
INVENTOR(S) : TATE & VARNELL

It is certified that error appears in the above-identified patent and that said Letters Patent is hereby corrected as shown below:

Column 4, Line 37, " kown "

should read -- known --

Column 6, Line 29, " Test "

should read -- Tent --

Column 6, Line 32, " panl "

should read -- panel --

UNITED STATES PATENT AND TRADEMARK OFFICE
CERTIFICATE OF CORRECTION

PATENT NO. : 4,855,212  Page 3 of 4
DATED : August 8, 1989
INVENTOR(S) : TATE & VARNELL It is certified that error appears in the above-identified patent and that said Letters Patent is hereby corrected as shown below:

Column 6, Line 39, " tended "

should read -- tented --

Column 8, Line 59, " 4/1 "

should read -- 4/2 --

Column 9, Line 37, " 47.12% "

should read -- 47.2% --

UNITED STATES PATENT AND TRADEMARK OFFICE
CERTIFICATE OF CORRECTION

PATENT NO. : 4,855,212  Page 4 of 4
DATED : August 8, 1989
INVENTOR(S) : TATE & VARNELL It is certified that error appears in the above-identified patent and that said Letters Patent is hereby corrected as shown below:

Column 14, Line 16, " bonder "

should read -- binder --

Column 14, Line 20, " reduced reduced "

omit first occurrence

Column 16, Claim 8, Line 26, " (1) "

should read -- (i) --

Signed and Sealed this

Twenty-sixth Day of June, 1990

Attest:

HARRY F. MANBECK, JR.

Attesting Officer   Commissioner of Patents and Trademarks